United States Patent
Cheng

(10) Patent No.: US 10,354,563 B2
(45) Date of Patent: Jul. 16, 2019

(54) CURVED DISPLAY DEVICE AND ASSEMBLING METHOD THEREFOR

(71) Applicants: HKC Corporation Limited, Shenzhen, Guangdong (CN); Chongqing HKC Optoelectronics Technology Co., Ltd., Chongqing (CN)

(72) Inventor: Jiahe Cheng, Chongqing (CN)

(73) Assignees: HKC Corporation Limited, Shenzhen, Guangdong (CN); Chongging HKC Optoelectronics Technology Co., Ltd., Chongging (CN)

( * ) Notice: Subject to any disclaimer, the term of this patent is extended or adjusted under 35 U.S.C. 154(b) by 5 days.

(21) Appl. No.: 15/550,932

(22) PCT Filed: May 19, 2017

(86) PCT No.: PCT/CN2017/085160
§ 371 (c)(1),
(2) Date: Aug. 14, 2017

(87) PCT Pub. No.: WO2018/205300
PCT Pub. Date: Nov. 15, 2018

(65) Prior Publication Data
US 2018/0330641 A1 Nov. 15, 2018

(30) Foreign Application Priority Data
May 12, 2017 (CN) .......................... 2017 1 0335058

(51) Int. Cl.
*G09F 19/22* (2006.01)
*G09F 9/30* (2006.01)
(Continued)

(52) U.S. Cl.
CPC ............. *G09F 9/301* (2013.01); *F16M 11/00* (2013.01); *G02F 1/133305* (2013.01);
(Continued)

(58) Field of Classification Search
CPC .... G09F 9/301; G09F 19/22; G02F 1/133305; G02F 1/133308; G02F 2001/133314;
(Continued)

(56) References Cited

U.S. PATENT DOCUMENTS 9,081,540 B1 * 7/2015 Cho ........................ G06F 1/1601
9,876,059 B2 * 1/2018 Yanagisawa ........ H01L 27/3244
(Continued)

FOREIGN PATENT DOCUMENTS

| CN | 2823768 Y | 10/2006 |
|---|---|---|
| CN | 101226780 A | 7/2008 |

(Continued)

*Primary Examiner* — Jia X Pan
(74) *Attorney, Agent, or Firm* — Muncy, Geissler, Olds & Lowe, P.C.

(57) ABSTRACT

This application relates to a curved display device and an assembling method therefor. The curved display device includes: a curved display device body having a display surface and a housing surface, where the display surface protrudes outwards, the housing surface and the display surface are disposed back-to-back, and the housing surface is recessed inwards; a wall mounting rack, disposed on the housing surface; and a wall mounting base, disposed on a wall body, where the wall mounting rack is fixed on the wall mounting base, so that a line connecting ends on two sides of the housing surface of the curved display device body horizontally overlaps with the wall body.

11 Claims, 12 Drawing Sheets

(51) Int. Cl.
*F16M 11/00* (2006.01)
*H01L 51/00* (2006.01)
*G02F 1/1333* (2006.01)

(52) U.S. Cl.
CPC ........ *G02F 1/133308* (2013.01); *G09F 19/22* (2013.01); *H01L 51/0097* (2013.01); *G02F 2001/133314* (2013.01); *G02F 2001/133317* (2013.01)

(58) Field of Classification Search
CPC ......... H01L 51/0097; H01L 2251/5338; A47B 97/001; F16M 11/00
See application file for complete search history.

(56) References Cited

U.S. PATENT DOCUMENTS

| | | | | |
|---|---|---|---|---|
| 2004/0159031 | A1* | 8/2004 | Chang | A47G 1/0616 40/800 |
| 2008/0018631 | A1* | 1/2008 | Hioki | G02F 1/133305 345/206 |
| 2008/0303976 | A1* | 12/2008 | Nishizawa | G02F 1/133305 349/64 |
| 2010/0000136 | A1* | 1/2010 | Allen | F16M 11/10 40/533 |
| 2013/0321740 | A1* | 12/2013 | An | H05K 5/0217 349/58 |
| 2015/0271931 | A1* | 9/2015 | Park | H04N 5/64 361/807 |
| 2016/0070304 | A1* | 3/2016 | Shin | H04M 1/0268 361/679.26 |
| 2016/0296018 | A1* | 10/2016 | Ahn | F16M 11/041 |
| 2017/0270835 | A1* | 9/2017 | Yang | G09F 9/30 |
| 2017/0271614 | A1* | 9/2017 | Lee | H05K 5/03 |
| 2017/0371204 | A1* | 12/2017 | Kaneki | G02F 1/133308 |

FOREIGN PATENT DOCUMENTS

| | | |
|---|---|---|
| CN | 204480609 U | 7/2015 |
| CN | 204534044 U | 8/2015 |
| CN | 204739393 U | 11/2015 |
| JP | 2011077114 A | 4/2011 |

* cited by examiner

CURVED DISPLAY DEVICE AND ASSEMBLING METHOD THEREFOR

BACKGROUND

Technical Field

This application relates to a curved display device and an assembling method therefor, and in particular, to a curved display device that enables a line connecting ends on two sides of a curved display device body to horizontally overlap with a wall mounting wall body after being assembled and mounted on a wall.

Related Art

Currently, display devices are usually flat display devices or curved display device with recessed-inward display surfaces. To reduce, to the greatest degree, the space occupied by a display device, display devices are continuously improved in the direction to be thinner, and are gradually changed to be mounted on a wall of a building by using a wall mounting rack from being placed on a television bench.

However, with the increasingly high requirements for appearance and quality by people, when a display device is installed by using a display device suspending rack in the prior art, a gap occurs between a housing, close to a wall of a building, of the display device and the wall to accommodate the depth of the wall mounting rack.

Most of the general display devices described herein are flat panel television apparatuses or curved television apparatuses. However, in most cases, a television apparatus is installed in an entrance area, for receiving guests, in a household space. Therefore, the gap existing in a public household space appears to be abrupt, and is unaesthetic.

SUMMARY

To resolve the foregoing technical problem, an objective of this application is to provide a curved display device that can be mounted on a wall. In the curved display device, a recessed-inward housing surface is formed by using a curvature of a protruding-outward display surface to form an accommodating space for accommodating the depth of the foregoing wall mounting rack.

The objective of this application is achieved and the technical problem thereof is resolved by using the following technical solutions. A curved display device according to this application comprises: a curved display device body having a display surface and a housing surface, where the display surface protrudes outwards, the housing surface and the display surface are disposed back-to-back, and the housing surface is recessed inwards; a wall mounting rack, disposed on the housing surface; and a wall mounting base, disposed on a wall body, where the wall mounting rack is fixed on the wall mounting base, so that a line connecting ends on two sides of the housing surface of the curved display device body horizontally overlaps with the wall body.

This application may further resolve the technical problem thereof by using the following technical measures.

In an embodiment of this application, the wall mounting rack has an inverted-U shape; one side of the inverted-U shape is a first fixing side and the wall mounting rack is disposed on the housing surface by using the first fixing side; a suspending structure with a downward notch extends from a highest point of the first fixing side away from the housing surface; the wall mounting base has a U shape; one side of the U shape is a second fixing side; the second fixing side is fixed on the wall body; a wall mounting structure with an upward notch extends from a lowest point of the second fixing side away from the wall body; and the wall mounting rack is fixed on the wall mounting base by placing the suspending structure into the notch of the wall mounting structure.

In an embodiment of this application, the wall mounting base comprises a fixing member, such as a locking component, that fixes the second fixing side on the wall body.

In an embodiment of this application, a buffer decorative bar is disposed on each of the ends on the two sides of the housing surface of the curved display device body; the buffer decorative bar is made of an elastic material having a buffer effect, such as rubber.

In an embodiment of this application, the wall mounting rack has an inverted-U shape; one side of the inverted-U shape is a first fixing side and the wall mounting rack is disposed on the housing surface by using the first fixing side; a suspending structure with a downward notch extends from a highest point of the first fixing side away from the housing surface; the wall mounting base has a U shape; one side of the U shape is a second fixing side; the second fixing side is fixed on the wall body; a wall mounting structure with an upward notch extends from a lowest point of the second fixing side away from the wall body; and the wall mounting rack is fixed on the wall mounting base by placing the suspending structure into the notch of the wall mounting structure.

In the foregoing embodiment of this application, the wall mounting rack is a block having an inverted-U shape.

In the foregoing embodiment of this application, the wall mounting rack is two or more sheets having inverted-U shapes; the sheets are disposed at corresponding positions with same horizontality and same depth.

In the foregoing embodiment of this application, an edge, adjacent to the notch, of the suspending structure is designed as a bevel edge that inclines from the suspending structure upwards to the first fixing side, and an edge, adjacent to the notch, of the wall mounting structure is designed as a bevel edge opposite to the notch of the wall mounting rack.

In the foregoing embodiment of this application, an engagement structure is disposed at an end adjacent to the notch of the suspending structure, to mutually engage with a corresponding position of the notch of the wall mounting structure.

This application further includes a method for assembling a curved display device, comprising: providing a curved display device body having a display surface and a housing surface, where the display surface protrudes outwards, the housing surface and the display surface are disposed back-to-back, and the housing surface is recessed inwards; disposing a wall mounting rack on the housing surface; disposing a wall mounting base on a wall body; and fixing the wall mounting rack on the wall mounting base, so that a line connecting ends on two sides of the housing surface of the curved display device body horizontally overlaps with the wall body.

Another objective of this application is to provide a curved display device, comprising: a curved display device body having a display surface and a housing surface, where the display surface protrudes outwards, the housing surface and the display surface are disposed back-to-back, and the housing surface is recessed inwards; a wall mounting rack, disposed on the housing surface; and a wall mounting base, disposed on a wall body, where the wall mounting rack is fixed on the wall mounting base, so that a line connecting ends on two sides of the housing surface of the curved display device body horizontally overlaps with the wall body; and the curved display device body is a liquid crystal display panel, an organic light emitting display (OLED) panel, a quantum dot light emitting display (QLED) panel, or a plasma display panel.

This application can beautify appearance after product installation, so as to improve the added value of the product.

DETAILED DESCRIPTION

The following embodiments are described with reference to the accompanying drawings, which are used to exemplify specific embodiments for implementation of this application. Terms about directions mentioned in this application, such as "on", "below", "front", "back", "left", "right", "in", "out", and "side surface" merely refer to directions of the accompanying drawings. Therefore, the used terms about directions are used to describe and understand this application, and are not intended to limit this application.

The accompanying drawings and the description are considered to be essentially exemplary, rather than limitative. In figures, modules with similar structures are represented by using the same reference number. In addition, for understanding and ease of description, the size and the thickness of each component shown in the accompanying drawings are arbitrarily shown, but this application is not limited thereto.

In the accompanying drawings, for clarity, the thicknesses of an area and the like are enlarged. In the accompanying drawings, for understanding and ease of description, thicknesses of some apparatuses and areas are enlarged. It should be understood that when a component such as an area or a base is described to be "on" "another component", the component may be directly on the another component, or there may be an intermediate component.

In addition, in this specification, unless otherwise explicitly described to have an opposite meaning, the word "include" is understood as including the component, but not excluding any other component. In addition, in this specification, "on" means that a component is located on or below a target component, but does not mean that the component needs to be located on top of the gravity direction.

To further describe the technical means adopted in this application to achieve the preset invention objective and effects thereof, specific implementations, structures, features, and effects of a curved display device and an assembling method therefor provided according to this application are described in detail below with reference to the drawings and preferred embodiments.

Figure 1A:
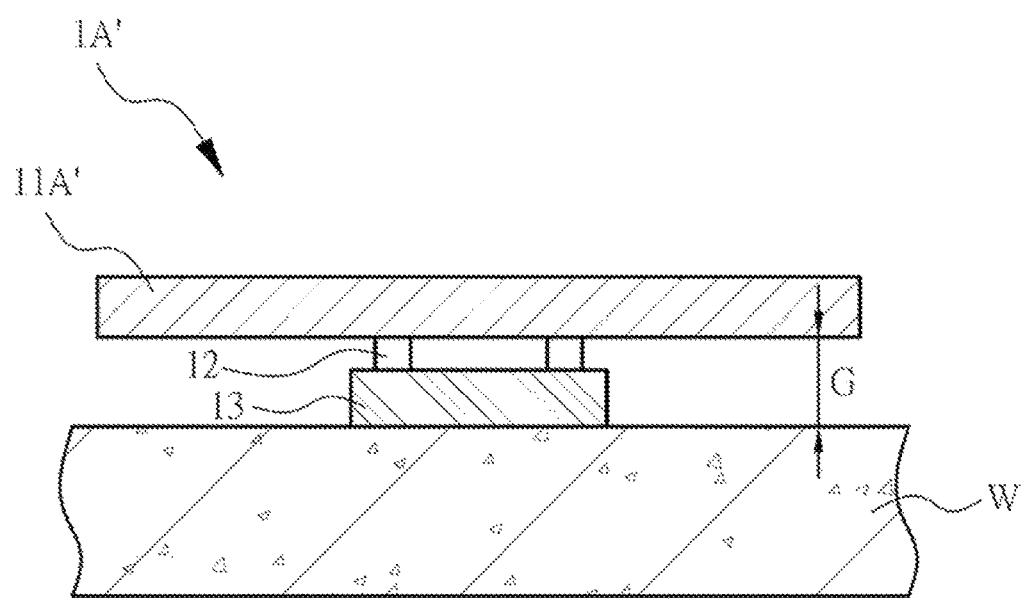
FIG. 1A is a schematic diagram of mounting an exemplary flat display device on a wall.
Figure 1B:
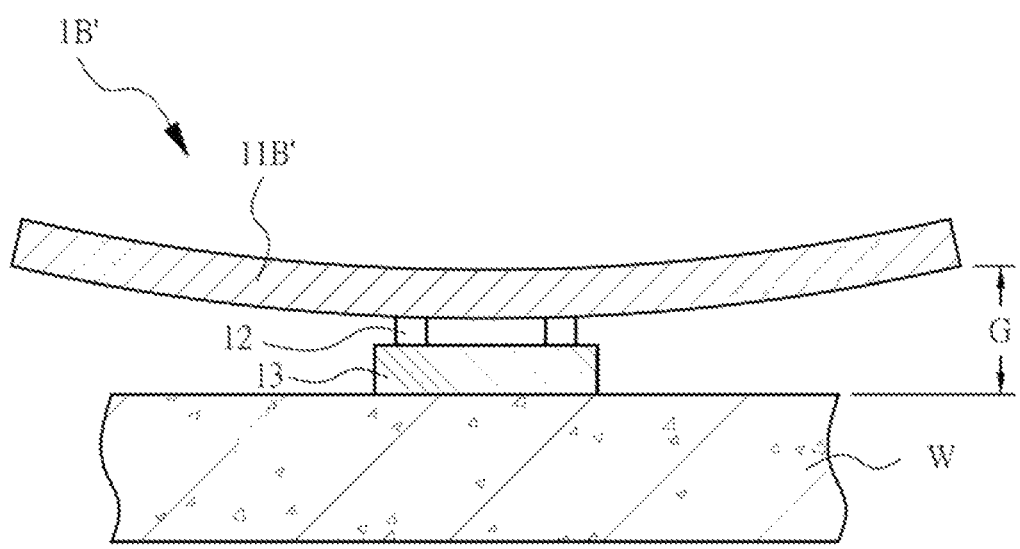
FIG. 1B is a schematic diagram of mounting an exemplary curved display device on a wall.

First referring to FIG. 1A and FIG. 1B, FIG. 1A is a schematic diagram of mounting an exemplary flat display device 1A' on a wall, and FIG. 1B is a schematic diagram of mounting an exemplary curved display device 1B' on a wall. As shown in the figures, the flat display device 1A' is disposed on a wall mounting base 13 by using a wall mounting rack 12 that is disposed on a flat display panel 11A' to face a wall body W, and this installation leads to a gap G between the flat display device 1A' and the wall body W. Similarly, in FIG. 1B, the curved display device 1B' is disposed on a wall mounting base 13 by using a wall mounting rack 12 that is disposed on a recessed-inward curved display device body 11B' to face a wall body W, and this installation leads to a gap G between the curved display device 1B' and the wall body W.

Figure 2A:
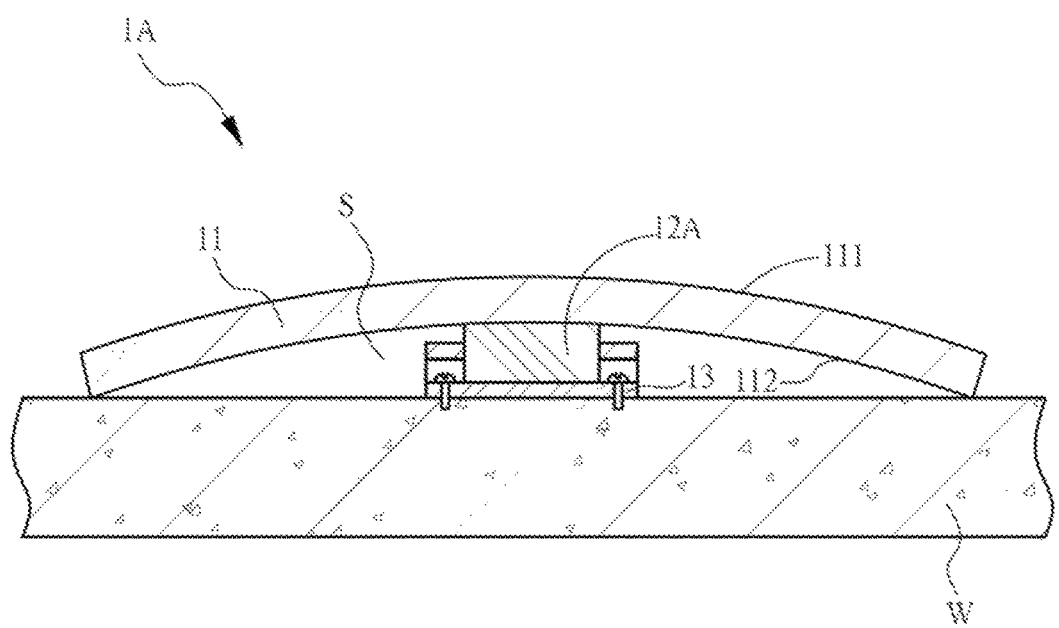
FIG. 2A is a schematic diagram of mounting a wall mounting rack on a wall according to an embodiment of this application.
Figure 2B:
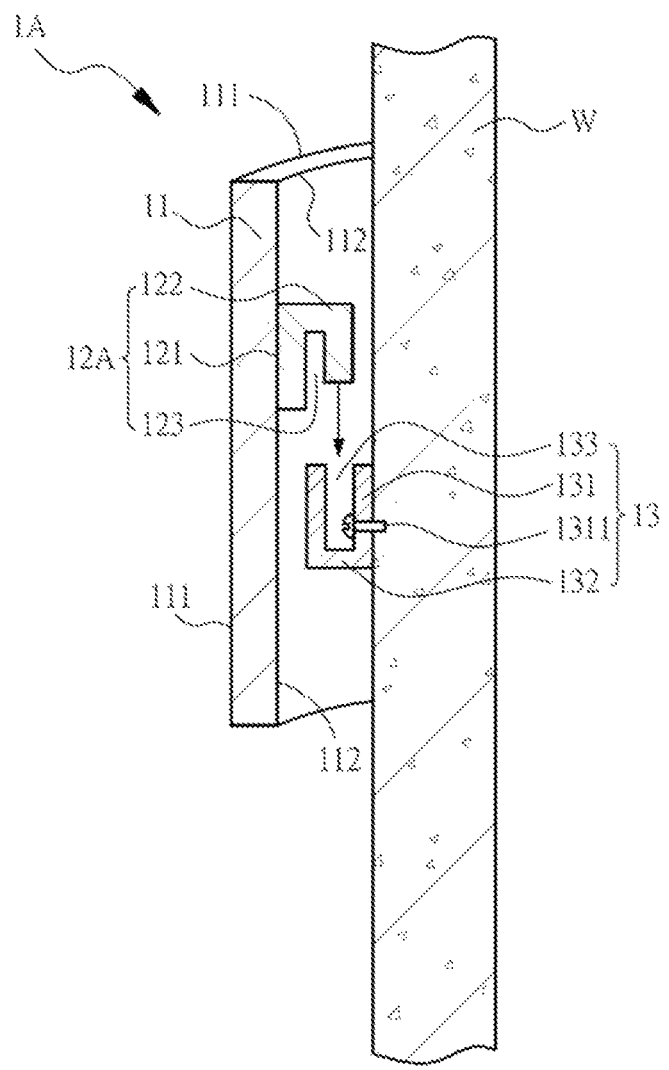
FIG. 2B is a schematic diagram of wall mounting combination according to an embodiment of this application.

However, a curved display device 1A according to FIG. 2A and FIG. 2B of this application includes: a curved display device body 11 having a display surface 111 and a housing surface 112, where the display surface protrudes outwards, the housing surface 112 and the display surface 111 are disposed back-to-back, and the housing surface 112 is recessed inwards; a wall mounting rack 12A, disposed on the housing surface 112; and a wall mounting base 13, disposed on a wall body W, where the wall mounting rack 12A is fixed on the wall mounting base 13, so that an accommodating space S is formed between the curved display device body 11 and the wall body W, and a line connecting ends on two sides of the housing surface 112 of the curved display device body 11 horizontally overlaps with the wall body W.

In the curved display device 1A, the wall mounting rack 12A has an inverted-U shape. One side of the inverted-U shape is a first fixing side 121 and the wall mounting rack 12A is disposed on the housing surface 112 by using the first fixing side 121. A suspending structure 122 with a downward notch 123 extends from a highest point of the first fixing side 121 away from the housing surface 112. The wall mounting base 13 has a U shape. One side of the U shape is a second fixing side 131. The second fixing side 131 is fixed on the wall body W. A wall mounting structure 132 with an upward notch 133 extends from a lowest point of the second fixing side 131 away from the wall body W. The wall mounting rack 12A is fixed on the wall mounting base 13 by placing the suspending structure 122 into the notch 133 of the wall mounting structure 132.

In an embodiment, the wall mounting base 13 includes a fixing member 1311, such as a locking component, that fixes the second fixing side 131 on the wall body W, and the wall mounting rack 12A is a block having an inverted-U shape.

Figure 2C:
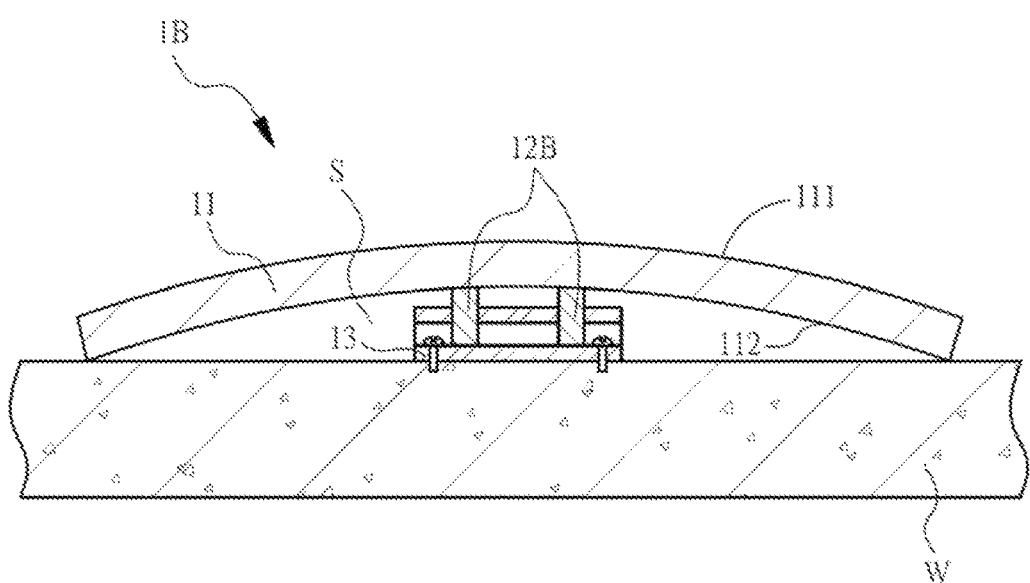
FIG. 2C is a schematic diagram of mounting a wall mounting rack on a wall according to another embodiment of this application.

The structure of a curved display device 1B in FIG. 2C according to another embodiment of this application is approximately the same as that of the curved display device 1A. However, the wall mounting rack 12B is two or more sheets having inverted-U shapes. The sheets are disposed on the housing surface 112 at corresponding positions with same horizontality and same depth.

Figure 3A:
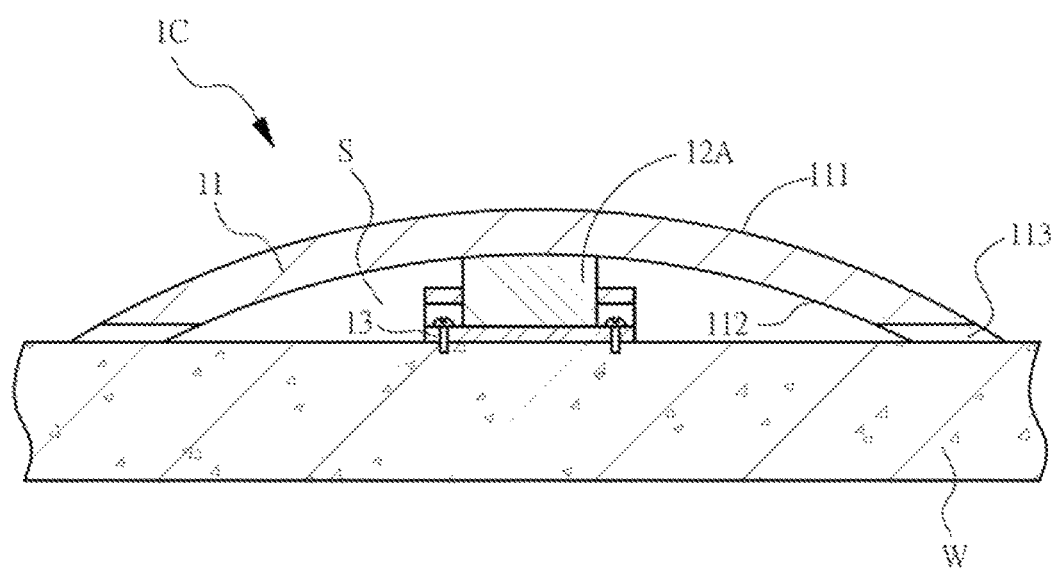
FIG. 3A is a schematic diagram of wall mounting combination of a wall mounting rack having buffer decorative bars according to an embodiment of this application.
Figure 3B:
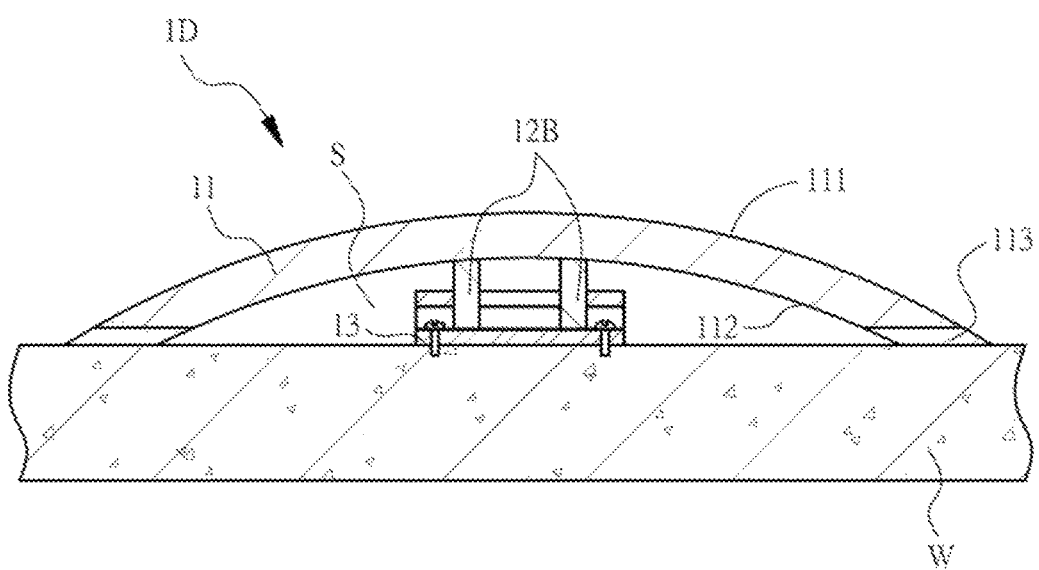
FIG. 3B is a schematic diagram of wall mounting combination of a wall mounting rack having buffer decorative bars according to another embodiment of this application.

Next, referring to FIG. 3A and FIG. 3B, FIG. 3A and FIG. 3B are schematic diagrams of embodiments in which buffer decorative bars 113 are used according to this application.

The structure of a curved display device 1C in FIG. 3A according to an embodiment of this application is approximately the same as that of the curved display device 1A. The wall mounting rack 12A is a block having an inverted-U shape. Moreover, a buffer decorative bar 113 is disposed on each of the ends on the two sides of the housing surface 112 of the curved display device body 11. The buffer decorative bar 113 is made of an elastic material having a buffer effect, such as rubber.

The structure of a curved display device 1D in FIG. 3B according to another embodiment of this application is approximately the same as that of the curved display device 1A. The wall mounting rack 12B is two or more sheets having inverted-U shapes. The sheets are disposed at corresponding positions with same horizontality and same depth. Moreover, a buffer decorative bar 113 is disposed on each of the ends on the two sides of the housing surface 112 of the curved display device body 11. The buffer decorative bar 113 is made of an elastic material having a buffer effect, such as rubber.

Figure 4A:
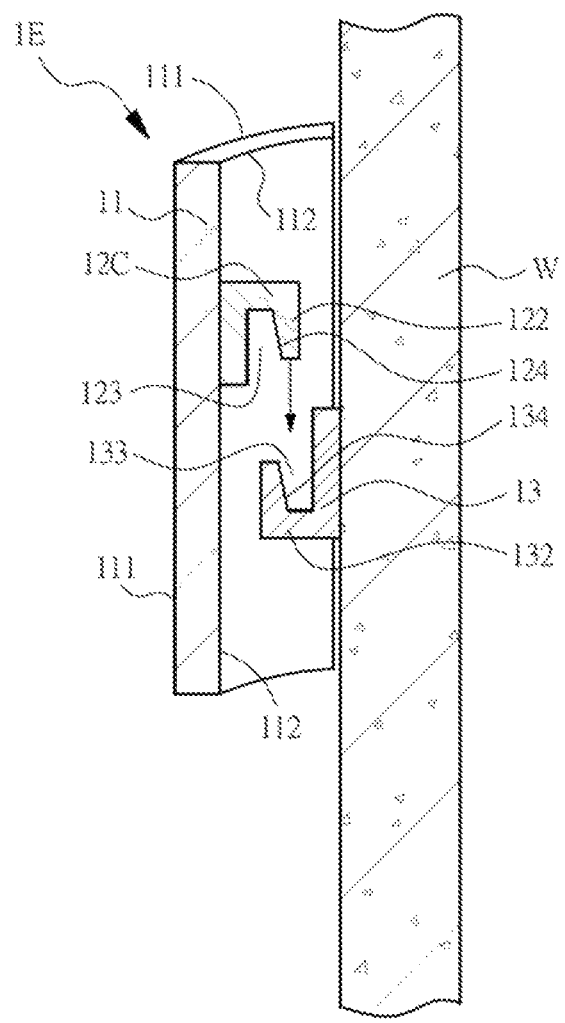
FIG. 4A is a schematic diagram before wall mounting combination of a suspending structure according to an embodiment of this application.
Figure 4B:
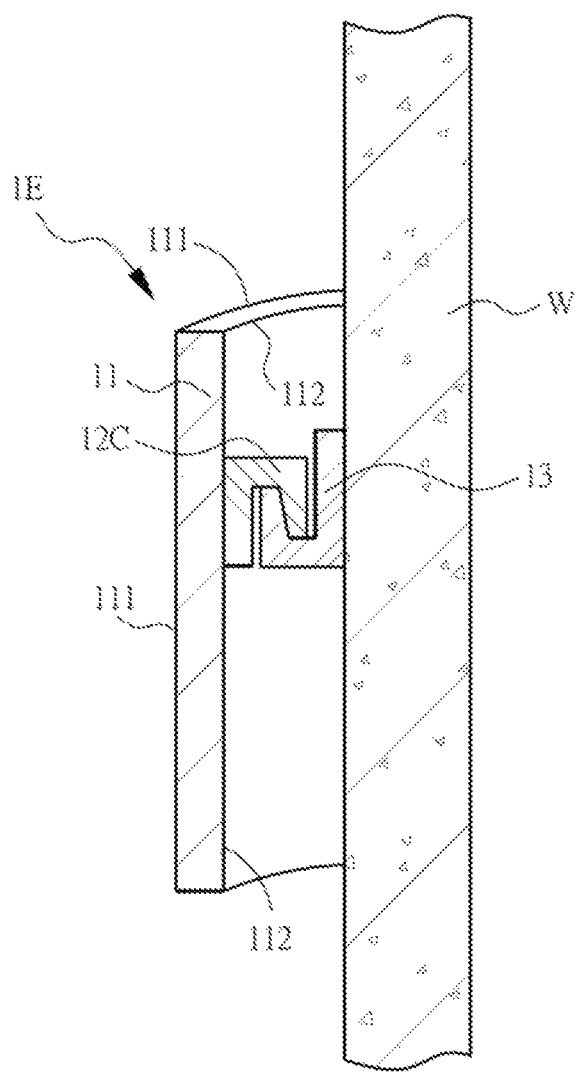
FIG. 4B is a schematic diagram after wall mounting combination of a suspending structure according to an embodiment of this application.
Figure 4C:
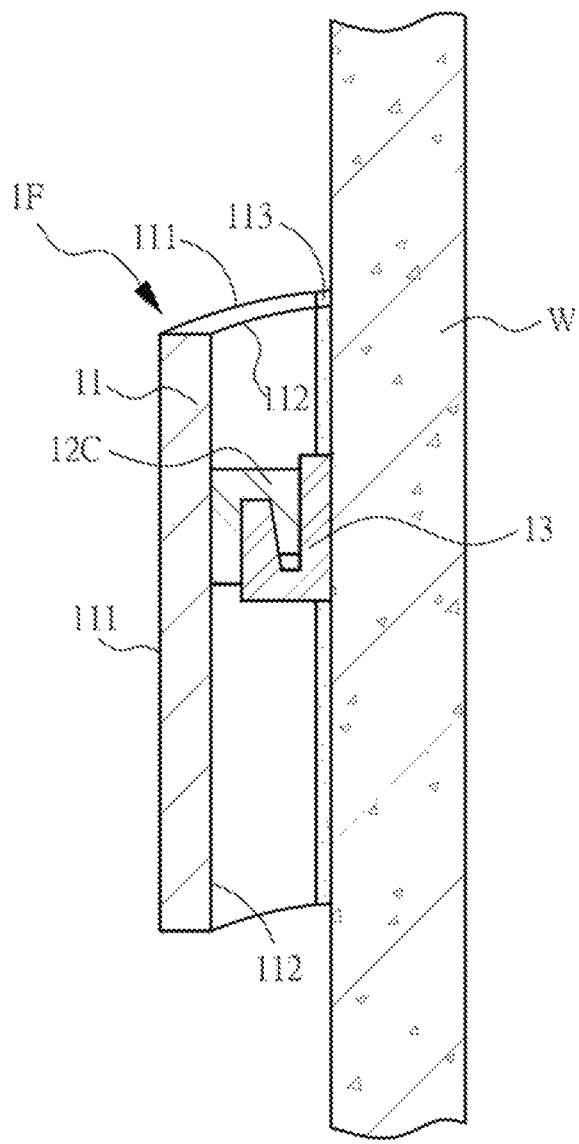
FIG. 4C is a schematic diagram of wall mounting combination of a suspending structure having buffer decorative bars according to an embodiment of this application.

Next, referring to FIG. 4A to FIG. 4C, FIG. 4A and FIG. 4B display a curved display device 1E according to this application. The curved display device 1E includes: a curved display device body 11 having a display surface 111 and a housing surface 112, where the display surface 111 protrudes outwards, the housing surface 112 and the display surface 111 are disposed back-to-back, and the housing surface 112 is recessed inwards; a wall mounting rack 12C, disposed on the housing surface 112; and a wall mounting base 13, disposed on a wall body W, where the wall mounting rack 12C is fixed on the wall mounting base 13, so that a line connecting ends on two sides of the housing surface 112 of the curved display device body 11 horizontally overlaps with the wall body W. The wall mounting rack 12C has an inverted-U shape. One side of the inverted-U shape is a first fixing side and the wall mounting rack 12C is disposed on the housing surface 112 by using the first fixing side. A suspending structure 122 with a downward notch 123 extends from a highest point of the first fixing side away from the housing surface. The wall mounting base 13 has a U shape. One side of the U shape is a second fixing side. The second fixing side is fixed on the wall body W. A wall mounting structure 132 with an upward notch 133 extends from a lowest point of the second fixing side away from the wall body. The wall mounting rack 12C is fixed on the wall mounting base 13 by placing the suspending structure 122 into the notch 133 of the wall mounting structure 132.

In the foregoing embodiment, an edge 124, adjacent to the notch 123, of the suspending structure 122 is designed as a bevel edge that inclines from the suspending structure upwards to the first fixing side, and an edge 134, adjacent to the notch 133, of the wall mounting structure 132 is designed as a bevel edge opposite to the notch of the wall mounting rack.

However, in a curved display device 1F in FIG. 4C according to this application includes: a curved display device body 11 having a display surface 111 and a housing surface 112, where the display surface 111 protrudes outwards, the housing surface 112 and the display surface 111 are disposed back-to-back, and the housing surface 112 is recessed inwards; a wall mounting rack 12C, disposed on the housing surface 112; and a wall mounting base 13, disposed on a wall body W, where the wall mounting rack 12C is fixed on the wall mounting base 13, so that a line connecting ends on two sides of the housing surface 112 of the curved display device body 11 horizontally overlaps with the wall body W. The wall mounting rack 12C has an inverted-U shape. As shown in FIG. 4A, one side of the inverted-U shape is a first fixing side and the wall mounting rack 12C is disposed on the housing surface 112 by using the first fixing side. A suspending structure 122 with a downward notch 123 extends from a highest point of the first fixing side away from the housing surface. The wall mounting base 13 has a U shape. One side of the U shape is a second fixing side. The second fixing side is fixed on the wall body W. A wall mounting structure 132 with an upward notch 133 extends from a lowest point of the second fixing side away from the wall body. The wall mounting rack 12C is fixed on the wall mounting base 13 by placing the suspending structure 122 into the notch 133 of the wall mounting structure 132.

In the foregoing embodiment, an edge 124, adjacent to the notch 123, of the suspending structure 122 is designed as a bevel edge that inclines from the suspending structure upwards to the first fixing side, and an edge 134, adjacent to the notch 133, of the wall mounting structure 132 is designed as a bevel edge opposite to the notch of the wall mounting rack (as shown in FIG. 4A). Moreover, a buffer decorative bar 113 is disposed on each of the ends on the two sides of the housing surface 112 of the curved display device body 11. The buffer decorative bar 113 is made of an elastic material having a buffer effect, such as rubber.

Figure 5A:
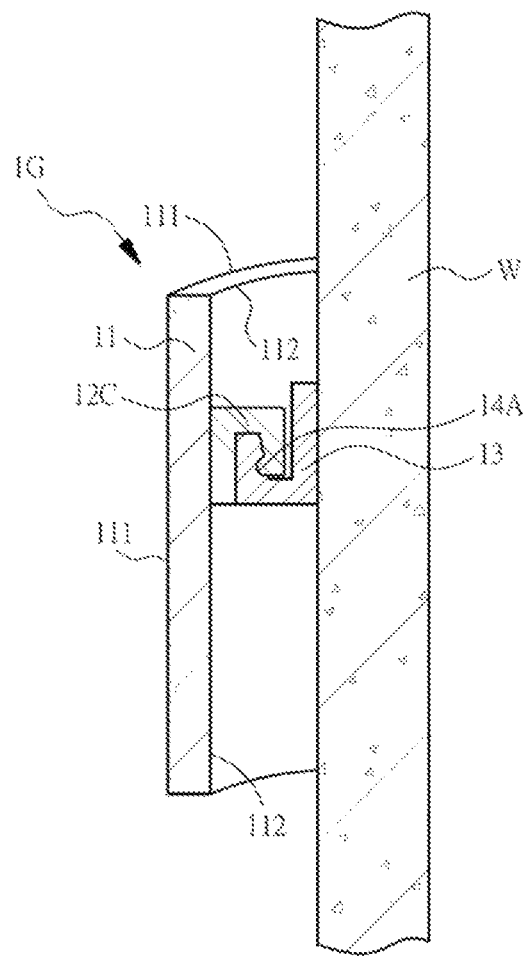
FIG. 5A is a schematic diagram of wall mounting combination of a suspending structure having an engagement structure according to an embodiment of this application.
Figure 5B:
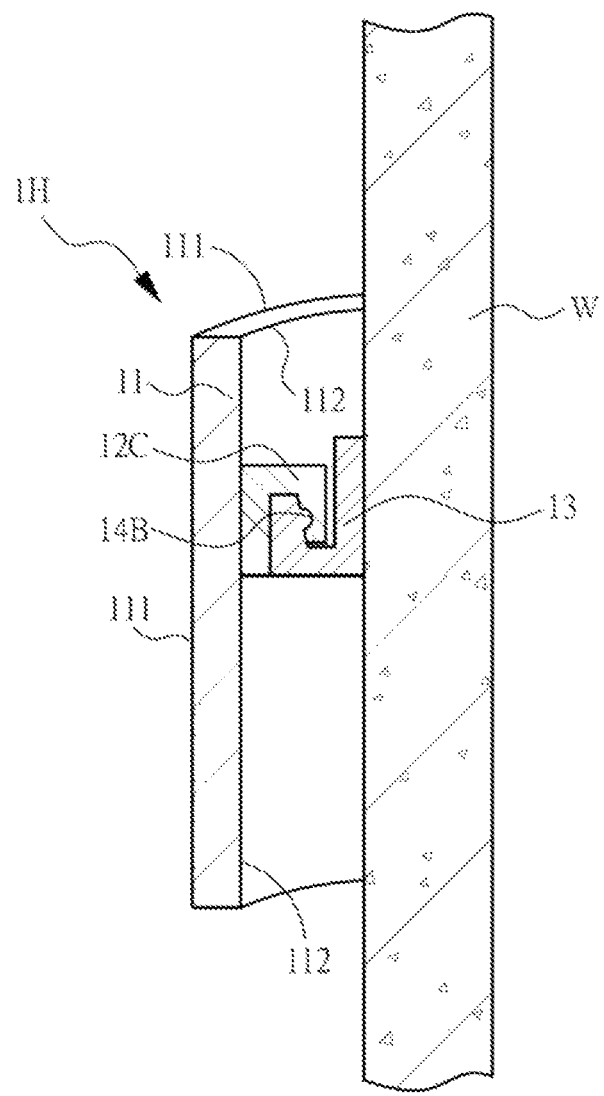
FIG. 5B is a schematic diagram of wall mounting combination of a suspending structure having an engagement structure according to another embodiment of this application.

Finally, referring to FIG. 5A and FIG. 5B, FIG. 5A and FIG. 5B are schematic diagrams of embodiments in which an engagement structure is used according to this application.

As shown in FIG. 5A, a curved display device 1G according to this application includes: a curved display device body 11 having a display surface 111 and a housing surface 112, where the display surface 111 protrudes outwards, the housing surface 112 and the display surface 111 are disposed back-to-back, and the housing surface 112 is recessed inwards; a wall mounting rack 12C, disposed on the housing surface 112; and a wall mounting base 13, disposed on a wall body W, where the wall mounting rack 12C is fixed on the wall mounting base 13, so that a line connecting ends on two sides of the housing surface 112 of the curved display device body 11 horizontally overlaps with the wall body W. The wall mounting rack 12C has an inverted-U shape. One side of the inverted-U shape is a first fixing side and the wall mounting rack 12C is disposed on the housing surface 112 by using the first fixing side. A suspending structure 122 with a downward notch 123 extends from a highest point of the first fixing side away from the housing surface. The wall mounting base 13 has a U shape. One side of the U shape is a second fixing side. The second fixing side is fixed on the wall body W. A wall mounting structure 132 with an upward notch 133 extends from a lowest point of the second fixing side away from the wall body. The wall mounting rack 12C is fixed on the wall mounting base 13 by placing the suspending structure 122 into the notch 133 of the wall mounting structure 132 (as shown in FIG. 4A). An engagement structure 14A is disposed at an end adjacent to the notch 123 of the suspending structure 122, to mutually engage with a corresponding position of the notch 133 of the wall mounting structure 132.

FIG. 5A displays a curved display device 1H according to this application. The curved display device 1H includes: a curved display device body 11 having a display surface 111 and a housing surface 112, where the display surface 111 protrudes outwards, the housing surface 112 and the display surface 111 are disposed back-to-back, and the housing surface 112 is recessed inwards; a wall mounting rack 12C, disposed on the housing surface 112; and a wall mounting base 13, disposed on a wall body W, where the wall mounting rack 12C is fixed on the wall mounting base 13, so that a line connecting ends on two sides of the housing surface 112 of the curved display device body 11 horizontally overlaps with the wall body W. The wall mounting rack 12C has an inverted-U shape. One side of the inverted-U shape is a first fixing side and the wall mounting rack 12C is disposed on the housing surface 112 by using the first fixing side. A suspending structure 122 with a downward notch 123 extends from a highest point of the first fixing side away from the housing surface. The wall mounting base 13 has a U shape. One side of the U shape is a second fixing side. The second fixing side is fixed on the wall body W. A wall mounting structure 132 with an upward notch 133 extends from a lowest point of the second fixing side away from the wall body. The wall mounting rack 12C is fixed on the wall mounting base 13 by placing the suspending structure 122 into the notch 133 of the wall mounting structure 132 (as shown in FIG. 4A). An engagement structure 14B is disposed at an end adjacent to the notch 123 of the suspending structure 122, to mutually engage with a corresponding position of the notch 133 of the wall mounting structure 132.

This application further includes a method for assembling a curved display device. As shown in FIG. 2B, the method includes: providing a curved display device body 11 having a display surface 111 and a housing surface 112, where the display surface 111 protrudes outwards, the housing surface 112 and the display surface 111 are disposed back-to-back, and the housing surface 112 is recessed inwards; disposing a wall mounting rack 12 on the housing surface 112; disposing a wall mounting base 13 on a wall body W; and fixing the wall mounting rack 12 on the wall mounting base 13, so that a line connecting ends on two sides of the housing surface 112 of the curved display device body 11 horizontally overlaps with the wall body W.

In various embodiments, the curved display panel of the curved display device body 11, for example, may be a liquid crystal display panel, an OLED panel, a QLED panel, a plasma display panel, or another display panel.

This application can beautify appearance after product installation, so as to improve the added value of the product.

Terms such as "in some embodiments" and "in various embodiments" are repeatedly used. Usually, the terms do not refer to the same embodiment; but they may also refer to the same embodiment. Words such as "comprise", "have", "include" are synonyms, unless other meanings are indicated in the context.

The foregoing descriptions are merely preferred embodiments of this application, and are not intended to limit this application in any form. Although this application has been disclosed above through the preferred embodiments, the embodiments are not intended to limit this application. Any person skilled in the art can make some equivalent variations or modifications according to the foregoing disclosed technical content without departing from the scope of the technical solutions of this application to obtain equivalent embodiments. Any simple amendment, equivalent change or modification made to the foregoing embodiments according to the technical essence of this application without departing from the content of the technical solutions of this application shall fall within the scope of the technical solutions of this application.

What is claimed is:

1. A curved display device, comprising:
    a curved display device body having a display surface and a housing surface, wherein the display surface protrudes outwards, the housing surface and the display surface are disposed back-to-back, and the housing surface is recessed inwards;
    a wall mounting rack, disposed on the housing surface; and
    a wall mounting base, disposed on a wall body, wherein the wall mounting rack is fixed on the wall mounting base, so that a line connecting ends on two sides of the housing surface of the curved display device body horizontally overlaps with the wall body,
    wherein
    the wall mounting rack has an inverted-U shape; one side of the inverted-U shape is a first fixing side and the wall mounting rack is disposed on the housing surface by using the first fixing side; a suspending structure with a downward notch extends from a highest point of the first fixing side away from the housing surface;
    the wall mounting base has a U shape; one side of the U shape is a second fixing side; the second fixing side is fixed on the wall body; a wall mounting structure with an upward notch extends from a lowest point of the second fixing side away from the wall body; and
    the wall mounting rack is fixed on the wall mounting base by placing the suspending structure into the notch of the wall mounting structure,
    wherein a buffer decorative bar is disposed on each of the ends on the two sides of the housing surface of the curved display device body,
    wherein an engagement structure is disposed at an end adjacent to the notch of the suspending structure, to mutually engage with a corresponding position of the notch of the wall mounting structure.

2. The curved display device according to claim 1, wherein the wall mounting base comprises a fixing member that fixes the second fixing side on the wall body.

3. The curved display device according to claim 1, wherein the buffer decorative bar is made of elastic material.

4. The curved display device according to claim 1, wherein the wall mounting rack is a block having an inverted-U shape.

5. The curved display device according to claim 1, wherein the wall mounting rack is two or more sheets having inverted-U shapes.

6. The curved display device according to claim 5, wherein the sheets are disposed at corresponding positions with same horizontality.

7. The curved display device according to claim 5, wherein the sheets are disposed at corresponding positions with same depth.

8. The curved display device according to claim 1, wherein an edge, adjacent to the notch, of the suspending structure is designed as a bevel edge that inclines from the suspending structure upwards to the first fixing side.

9. The curved display device according to claim 1, wherein an edge, adjacent to the notch, of the wall mounting structure is designed as a bevel edge opposite to the notch of the wall mounting rack.

10. A method for assembling a curved display device, comprising:
   providing a curved display device body having a display surface and a housing surface, wherein the display surface protrudes outwards, the housing surface and the display surface are disposed back-to-back, and the housing surface is recessed inwards;
   disposing a wall mounting rack on the housing surface;
   disposing a wall mounting base on a wall body; and
   fixing the wall mounting rack on the wall mounting base, so that a line connecting ends on two sides of the housing surface of the curved display device body horizontally overlaps with the wall body,
   wherein
   the wall mounting rack has an inverted-U shape; one side of the inverted-U shape is a first fixing side and the wall mounting rack is disposed on the housing surface by using the first fixing side; a suspending structure with a downward notch extends from a highest point of the first fixing side away from the housing surface;
   the wall mounting base has a U shape; one side of the U shape is a second fixing side; the second fixing side is fixed on the wall body; a wall mounting structure with an upward notch extends from a lowest point of the second fixing side away from the wall body; and
   the wall mounting rack is fixed on the wall mounting base by placing the suspending structure into the notch of the wall mounting structure,
   wherein a buffer decorative bar is disposed on each of the ends on the two sides of the housing surface of the curved display device body,
   wherein an engagement structure is disposed at an end adjacent to the notch of the suspending structure, to mutually engage with a corresponding position of the notch of the wall mounting structure.

11. A curved display device, comprising:
   a curved display device body having a display surface and a housing surface, wherein the display surface protrudes outwards, the housing surface and the display surface are disposed back-to-back, and the housing surface is recessed inwards;
   a wall mounting rack, disposed on the housing surface; and
   a wall mounting base, disposed on a wall body, wherein the wall mounting rack is fixed on the wall mounting base, so that a line connecting ends on two sides of the housing surface of the curved display device body horizontally overlaps with the wall body; and
   the curved display device body is a liquid crystal display panel, an organic light emitting display panel, a quantum dot light emitting display panel, or a plasma display panel,
   wherein
   the wall mounting rack has an inverted-U shape; one side of the inverted-U shape is a first fixing side and the wall mounting rack is disposed on the housing surface by using the first fixing side; a suspending structure with a downward notch extends from a highest point of the first fixing side away from the housing surface;
   the wall mounting base has a U shape; one side of the U shape is a second fixing side; the second fixing side is fixed on the wall body; a wall mounting structure with an upward notch extends from a lowest point of the second fixing side away from the wall body; and
   the wall mounting rack is fixed on the wall mounting base by placing the suspending structure into the notch of the wall mounting structure,
   wherein a buffer decorative bar is disposed on each of the ends on the two sides of the housing surface of the curved display device body,
   wherein an engagement structure is disposed at an end adjacent to the notch of the suspending structure, to mutually engage with a corresponding position of the notch of the wall mounting structure.

* * * * *